(12) United States Patent
Fukasaku et al.

(10) Patent No.: US 12,308,708 B2
(45) Date of Patent: May 20, 2025

(54) MOTOR-DRIVEN COMPRESSOR

(71) Applicant: KABUSHIKI KAISHA TOYOTA JIDOSHOKKI, Kariya (JP)

(72) Inventors: Hiroshi Fukasaku, Kariya (JP); Yoshiki Nagata, Kariya (JP); Takashi Kawashima, Kariya (JP); Shunsuke Ambo, Kariya (JP); Shun Ito, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 286 days.

(21) Appl. No.: 18/181,627

(22) Filed: Mar. 10, 2023

(65) Prior Publication Data

US 2023/0299648 A1  Sep. 21, 2023

(30) Foreign Application Priority Data

Mar. 18, 2022  (JP) .................................. 2022-043987

(51) Int. Cl.
| | |
|---|---|
| *H02K 11/33* | (2016.01) |
| *F25B 31/02* | (2006.01) |
| *H01F 27/24* | (2006.01) |
| *H01F 27/30* | (2006.01) |
| *H02K 7/14* | (2006.01) |
| *H03H 7/01* | (2006.01) |

(52) U.S. Cl.
CPC ............ *H02K 11/33* (2016.01); *F25B 31/026* (2013.01); *H01F 27/24* (2013.01); *H01F 27/306* (2013.01); *H02K 7/14* (2013.01); *H03H 7/0115* (2013.01)

(58) Field of Classification Search
CPC .......... H02K 11/33; H02K 7/14; H02K 11/02; F25B 31/026; F25B 31/006; H01F 27/24; H01F 27/306; H01F 2027/065; H01F 27/02; H01F 27/06; H01F 2017/0093; H01F 37/00; H03H 7/0115
See application file for complete search history.

(56) References Cited

U.S. PATENT DOCUMENTS

2017/0288512 A1  10/2017  Kagawa et al.
2020/0298654 A1*  9/2020  Kagawa ............. B60H 1/00642

FOREIGN PATENT DOCUMENTS

| JP | 2017-180428 A | 10/2017 |
| JP | 2021-132427 A | 9/2021 |
| WO | 2017/170819 A1 | 10/2017 |

* cited by examiner

*Primary Examiner* — Christopher M Koehler
*Assistant Examiner* — Riley Owen Stout
(74) *Attorney, Agent, or Firm* — Sughrue Mion, PLLC

(57) ABSTRACT

A damping unit includes a damping bent portion having the form of a flat plate and bent from a damping side portion. The damping bent portion is thermally coupled to a heat dissipation surface. This transfers the heat generated by the damping unit from the damping bent portion, in addition to the damping side portion, to the heat dissipation surface of an inverter case.

5 Claims, 5 Drawing Sheets

MOTOR-DRIVEN COMPRESSOR

BACKGROUND

1. Field

The following description relates to a motor-driven compressor.

2. Description of Related Art

A motor-driven compressor includes a housing, a compression unit, an electric motor, and an inverter device. Fluid is drawn into the housing. The compression unit compresses the fluid. The electric motor drives the compression unit. The inverter device drives the electric motor. The inverter device includes an inverter circuit. The inverter circuit converts direct-current power to alternating-current power. The inverter device includes a noise reducing unit. The noise reducing unit is arranged at an input side of the inverter circuit. The noise reducing unit includes a common mode choke coil and a smoothing capacitor. The smoothing capacitor forms a low-pass filter circuit with the common mode choke coil. The noise reducing unit reduces common mode noise and normal mode noise included in a direct-current power before the direct-current power is input to the inverter circuit. Further, the inverter device includes an inverter case. The inverter case is thermally coupled to the housing. The inverter case accommodates the inverter circuit and the noise reducing unit.

The common mode choke coil includes a core having a closed shape, a first winding, and a second winding. The first winding is wound around the core. The second winding is wound around the core opposing the second winding. International Patent Publication No. 2017/170819 describes an example of an inverter device that further includes a damping unit. The damping unit forms a magnetic path through which a leakage magnetic flux produced by the common mode choke coil flows to increase leakage inductance of the common mode choke coil. The damping unit is formed by a metal ferromagnetic body. The damping unit includes a damping side portion. The damping side portion covers at least part of a side surface of the common mode choke coil. The damping side portion includes a distal end thermally coupled to a heat dissipation surface of the inverter case or the housing.

The leakage magnetic flux produced by the common mode choke coil flows through the damping unit and generates an eddy current in the damping unit. The damping unit converts the eddy current to heat. Since the damping unit acts as a resistor with respect to the leakage magnetic flux, the damping unit obtains a damping effect. This lowers the resonance peak resulting from the low-pass filter circuit. The heat generated by the damping unit is transferred from the damping side portion to the heat dissipation surface. Then, the heat dissipation surface dissipates the heat generated by the damping unit.

It is desirable that the heat dissipation of such a damping unit be improved.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a motor-driven compressor is provided. The motor-driven compressor includes a housing into which fluid is drawn, a compression unit configured to compress the fluid, an electric motor configured to drive the compression unit, and an inverter device configured to drive the electric motor. The inverter device includes an inverter circuit, a noise reducing unit, and an inverter case. The inverter circuit is configured to convert direct-current power to alternating-current power. The noise reducing unit is arranged at an input side of the inverter circuit and configured to reduce common mode noise and normal mode noise included in the direct-current power before the direct-current power is input to the inverter circuit. The inverter case is thermally coupled to the housing and accommodates the inverter circuit and the noise reducing unit. The noise reducing unit includes a common mode choke coil and a smoothing capacitor forming a low-pass filter circuit with the common mode choke coil. The common mode choke coil includes a core having a closed shape, a first winding wound around the core, and a second winding wound around the core opposing the first winding. The inverter device further includes a damping unit that forms a magnetic path through which leakage magnetic flux produced by the common mode choke coil to increase leakage inductance of the common mode choke coil. The damping unit is formed from a metal ferromagnetic body. The damping unit includes a damping side portion that covers at least part of a side surface of the common mode choke coil. The damping side portion is thermally coupled to a heat dissipation surface of the inverter case or the housing. The damping unit includes a damping bent portion having the form of a flat plate and bent from the damping side portion. The damping bent portion is thermally coupled to the heat dissipation surface.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

A motor-driven compressor in accordance with an embodiment will now be described with reference to FIGS. 1 to 7. The motor-driven compressor of the present embodiment is for use with, for example, a vehicle air conditioner.

Vehicle Air Conditioner 10

Figure 1:
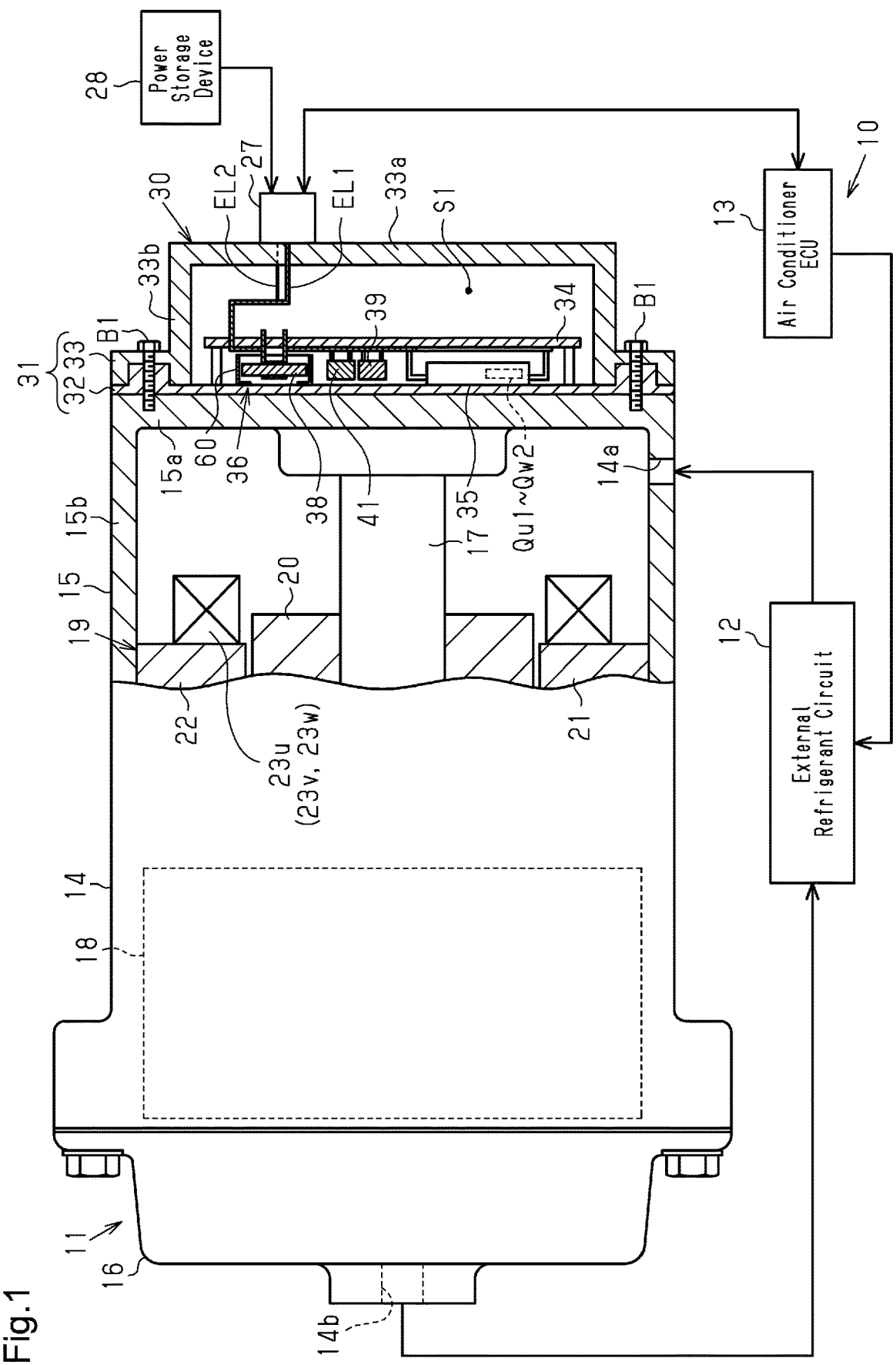
FIG. 1 is a cross-sectional side view of a motor-driven compressor in accordance with an embodiment.

As shown in FIG. 1, a vehicle air conditioner 10 includes a motor-driven compressor 11 and an external refrigerant circuit 12. The external refrigerant circuit 12 supplies a refrigerant, which is a fluid, to the motor-driven compressor 11. The external refrigerant circuit 12 includes, for example, a heat exchanger and an expansion valve. The vehicle air conditioner 10 cools or warms the passenger compartment by compressing the refrigerant with the motor-driven compressor 11 and performing heat exchange and expansion on the refrigerant with the external refrigerant circuit 12.

The vehicle air conditioner 10 includes an air conditioner electronic control unit (ECU) 13. The air conditioner ECU 13 controls the entire vehicle air conditioner 10. The air conditioner ECU 13 is configured to obtain the temperature of the passenger compartment, the target temperature of the passenger compartment, and the like. Based on parameters such as the temperature of the passenger compartment and the target temperature of the passenger compartment, the air conditioner ECU 13 transmits instructions, such as an ON-OFF instruction, to the motor-driven compressor 11.

Structure of Motor-Driven Compressor 11

The motor-driven compressor 11 includes a housing 14. The housing 14 is formed from, for example, a heat-conductive metal material, such as aluminum. The housing 14 is connected to ground via the body of the vehicle.

The housing 14 includes a suction housing 15 and a discharge housing 16. The suction housing 15 is coupled to the discharge housing 16. The suction housing 15 includes a flat end wall 15a and a cylindrical circumferential wall 15b. The circumferential wall 15b extends from a circumferential portion of the end wall 15a. The discharge housing 16, coupled to the suction housing 15, closes the opening of the suction housing 15. This forms a cavity in the housing 14.

The housing 14 includes a suction port 14a. The refrigerant is drawn from the external refrigerant circuit 12 into the suction port 14a. Thus, the refrigerant is drawn into the housing 14. The suction port 14a is formed in the circumferential wall 15b of the suction housing 15. Specifically, the suction port 14a is formed in the circumferential wall 15b of the suction housing 15 at a portion closer to the end wall 15a than the discharge housing 16. The housing 14 includes a discharge port 14b. The refrigerant is discharged from the discharge port 14b to the external refrigerant circuit 12. The discharge port 14b is formed in the discharge housing 16.

The motor-driven compressor 11 includes a rotation shaft 17, a compression unit 18, and an electric motor 19. The housing 14 accommodates the rotation shaft 17, the compression unit 18, and the electric motor 19. The rotation shaft 17 is supported by the housing 14 and is rotatable relative to the housing 14. The rotation shaft 17 is arranged in the housing 14 such that an axial direction of the rotation shaft 17 coincides with an axial direction of the circumferential wall 15b.

The compression unit 18 is accommodated in the suction housing 15. The compression unit 18 is of, for example, a scroll type and includes a fixed scroll (not shown) fixed in the suction housing 15 and an orbiting scroll (not shown) arranged opposing the fixed scroll. The compression unit 18 is arranged in the suction housing 15 at a position closer to the discharge port 14b than the suction port 14a. The compression unit 18 is coupled to the rotation shaft 17. Rotation of the rotation shaft 17 drives the compression unit 18 and compresses the refrigerant.

The electric motor 19 is accommodated in the suction housing 15. The electric motor 19 is arranged between the compression unit 18 and the end wall 15a in the suction housing 15. The electric motor 19 includes a rotor 20 and a stator 21. The stator 21 includes a cylindrical stator core 22, a u-phase coil 23u, a v-phase coil 23v, and a w-phase coil 23w.

The u-phase coil 23u, the v-phase coil 23v, and the w-phase coil 23w are wound around the stator core 22. For example, the u-phase coil 23u, the v-phase coil 23v, and the w-phase coil 23w form a Y-connection. The u-phase coil 23u, the v-phase coil 23v, and the w-phase coil 23w do not have to form a Y-connection and may form, for example, a delta connection.

The rotor 20 is cylindrical. The rotor 20 is fixed to the rotation shaft 17. Thus, the rotation shaft 17 is configured to rotate integrally with the rotor 20. The stator 21 is fixed to the circumferential wall 15b of the suction housing 15. The rotor 20 and the stator 21 are opposed to each other in a radial direction of the rotation shaft 17.

The rotor 20 rotates when the u-phase coil 23u, the v-phase coil 23v, and the w-phase coil 23w are energized in a predetermined pattern. The rotation of the rotor 20 rotates the rotation shaft 17. This drives the compression unit 18. Therefore, the electric motor 19 drives the compression unit 18. Further, the refrigerant flowing through the external refrigerant circuit 12 is drawn into the housing 14 through the suction port 14a. The compression unit 18 compresses the refrigerant drawn into the housing 14. The compressed refrigerant is discharged from the discharge port 14b to the external refrigerant circuit 12.

The motor-driven compressor 11 includes an inverter device 30. The inverter device 30 drives the electric motor 19. The inverter device 30 includes an inverter case 31. The inverter case 31 is formed from, for example, a metal material such as aluminum.

The inverter case 31 includes a base 32 and a cover 33. The base 32 has the form of a plate. The base 32 is in contact with an outer surface of the end wall 15a of the suction housing 15 with thermal grease (not shown) applied therebetween. This thermally couples the inverter case 31 to the housing 14. The cover 33 includes a flat end wall 33a and a cylindrical circumferential wall 33b. The cover 33 is coupled to the base 32 such that the open end of the circumferential wall 33b abuts against the base 32. The base 32 and the cover 33 form an inverter accommodation chamber S1. Therefore, the inverter case 31 includes the inverter accommodation chamber S1. The base 32 and the cover 33 are fastened to the suction housing 15 by bolts B1. This fastens the inverter device 30 to the housing 14.

The motor-driven compressor 11 includes a connector 27. The connector 27 is electrically connected to a power storage device 28 installed in the vehicle. The connector 27 is arranged on the inverter case 31. The connector 27 projects from the end wall 33a of the cover 33. The power storage device 28 serves as a power supply that supplies electric power to in-vehicle devices. The power storage device 28 is a direct-current power supply. The power storage device 28 is, for example, a rechargeable battery or a capacitor.

The inverter device 30 includes a circuit board 34. The circuit board 34 is accommodated in the inverter accommodation chamber S1. The circuit board 34 is arranged opposing the end wall 15a and separated from the end wall 15a by a predetermined distance in the axial direction of the rotation shaft 17. The circuit board 34 is accommodated in the inverter accommodation chamber S1 such that a thicknesswise direction of the circuit board 34 coincides with the axial direction of the rotation shaft 17.

The inverter device 30 includes an inverter circuit 35 and a noise reducing unit 36. The inverter circuit 35 converts direct-current power to alternating-current power. The noise reducing unit 36 is arranged at an input side of the inverter circuit 35. The noise reducing unit 36 reduces common mode noise and normal mode noise included in a direct-current power before the direct-current power is input to the inverter circuit 35. The inverter circuit 35 and the noise reducing unit 36 are mounted on the circuit board 34. Therefore, the inverter case 31 accommodates the inverter circuit 35 and the noise reducing unit 36.

Inverter Circuit 35

Figure 2:
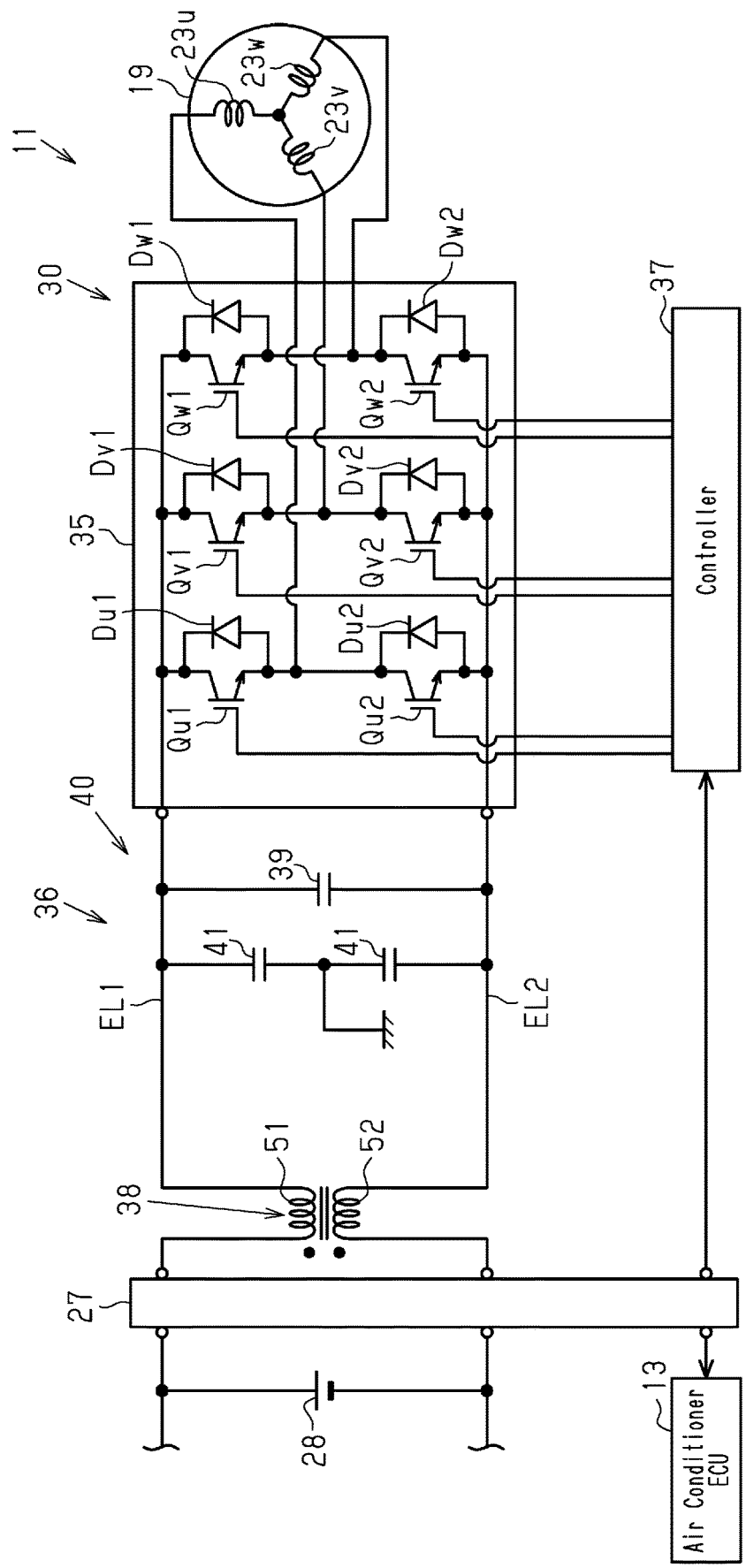
FIG. 2 is a circuit diagram showing the electrical configuration of the motor-driven compressor.

As shown in FIG. 2, the inverter circuit 35 includes two connection lines EL1 and EL2. The inverter circuit 35 includes u-phase switching elements Qu1 and Qu2 that correspond to the u-phase coil 23u. The inverter circuit 35 includes v-phase switching elements Qv1 and Qv2 that correspond to the v-phase coil 23v. The inverter circuit 35 includes w-phase switching elements Qw1 and Qw2 that correspond to the w-phase coil 23w. Each of the switching elements Qu1 to Qw2 is, for example, a power switching element such as an insulated-gate bipolar transistor (IGBT). The switching elements Qu1, Qu2, Qv1, Qv2, Qw1, and Qw2 respectively include freewheeling diodes (body diodes) Du1, Du2, Dv1, Dv2, Dw1, and Dw2.

The u-phase switching elements Qu1 and Qu2 are connected in series to each other. A portion between the u-phase switching elements Qu1 and Qu2 is connected to the u-phase coil 23u. The series-connected body of the u-phase switching elements Qu1 and Qu2 is electrically connected to both of the connection lines EL1 and EL2.

The v-phase switching elements Qv1 and Qv2 are connected in series to each other. A portion between the v-phase switching elements Qv1 and Qv2 is connected to the v-phase coil 23v. The series-connected body of the v-phase switching elements Qv1 and Qv2 is electrically connected to both of the connection lines EL1 and EL2.

The w-phase switching elements Qw1 and Qw2 are connected in series to each other. A portion between the w-phase switching elements Qw1 and Qw2 is connected to the w-phase coil 23w. The series-connected body of the w-phase switching elements Qw1 and Qw2 is electrically connected to both of the connection lines EL1 and EL2.

The inverter device 30 includes a controller 37. The controller 37 controls switching operations of the switching elements Qu1 to Qw2. The controller 37 may be implemented by, for example, one or more dedicated hardware circuits and/or one or more processors (control circuits) that run on a computer program (software). The processor includes a central processing unit (CPU) and a memory such as a random-access memory (RAM) or a read-only memory (ROM). The memory stores, for example, program codes or commands that are configured to have the processor execute various processes. The memory, which is a computer readable medium, may be any available medium that is accessible by a versatile or dedicated computer.

The controller 37 is electrically connected to the air conditioner ECU 13 by the connector 27. The controller 37 cyclically turns on and off the switching elements Qu1 to Qw2 based on instructions from the air conditioner ECU 13. Specifically, the controller 37 executes pulse width modulation control (PWM control) on the switching elements Qu1 to Qw2 based on instructions from the air conditioner ECU 13. More specifically, the controller 37 generates a control signal using a carrier signal (carrier wave signal) and an instruction voltage signal (comparison subject signal). Then, the controller 37 uses the generated control signal to execute ON/OFF control on the switching elements Qu1 to Qw2. This converts direct-current power to alternating-current power.

Noise Reducing Unit 36

The noise reducing unit 36 includes a common mode choke coil 38 and a smoothing capacitor 39. The smoothing capacitor 39 forms a low-pass filter circuit 40 with the common mode choke coil 38. The low-pass filter circuit 40 is arranged on the connection lines EL1 and EL2. The low-pass filter circuit 40 is arranged between the connector 27 and the inverter circuit 35. The common mode choke coil 38 is arranged in both of the connection lines EL1 and EL2.

The smoothing capacitor 39 is arranged closer to the inverter circuit 35 than the common mode choke coil 38. The smoothing capacitor 39 is an X-capacitor connected in parallel to the inverter circuit 35. The smoothing capacitor 39 is electrically connected to the two connection lines EL1 and EL2. The common mode choke coil 38 and the smoothing capacitor 39 form an LC resonance circuit. Thus, the low-pass filter circuit 40 of the present embodiment is an LC resonance circuit including the common mode choke coil 38.

The noise reducing unit 36 includes two Y-capacitors 41. The two Y-capacitors 41 are connected in series to each other. A portion between the two Y-capacitors 41 is connected to ground by the body of the vehicle via the inverter case 31 and the housing 14. The two Y-capacitors 41 are arranged closer to the inverter circuit 35 than the common mode choke coil 38. The two Y-capacitors 41 are connected in parallel to the common mode choke coil 38. The two Y-capacitors 41 are connected in parallel to the smoothing capacitor 39. The two Y-capacitors 41 are arranged between the common mode choke coil 38 and the smoothing capacitor 39.

The common mode choke coil 38 blocks the transmission of high-frequency noise produced at the vehicle side to the inverter circuit 35 of the motor-driven compressor 11. The common mode choke coil 38 uses leakage inductance as normal inductance. Therefore, the common mode choke coil 38 is used as the L element of the low-pass filter circuit (LC filter) 40 and removes normal mode noise (differential mode noise). In other words, the common mode choke coil 38 is applicable to common mode noise and normal mode noise (differential mode noise). Accordingly, the motor-driven compressor 11 of the present embodiment uses the common mode choke coil 38 that is applicable to the two modes of noise instead of using a common mode choke coil and a normal mode (differential mode) choke coil.

Common Mode Choke Coil 38

Figure 3:
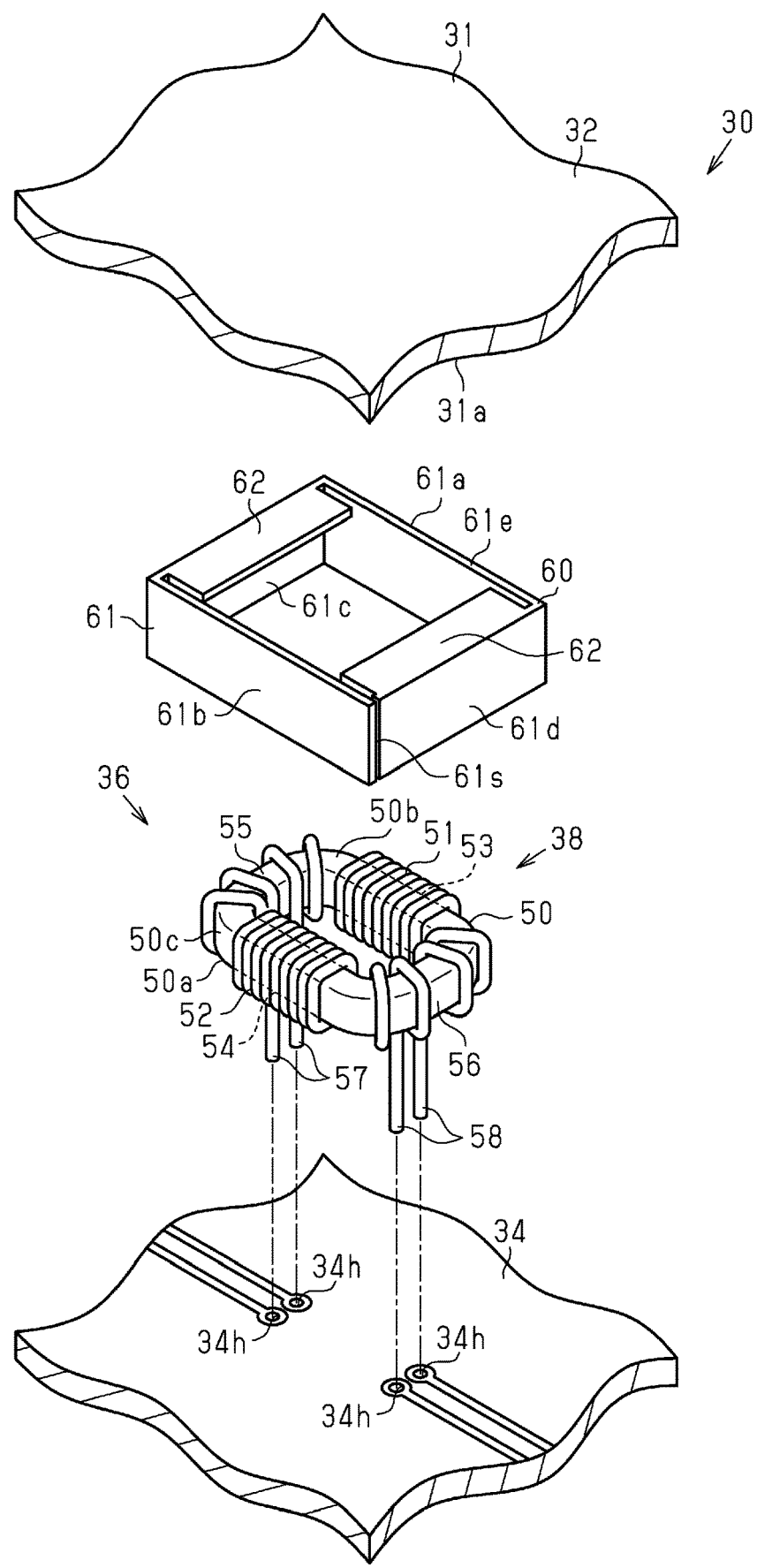
FIG. 3 is an exploded perspective view schematically showing the structure of a noise reducing unit.
Figure 4:
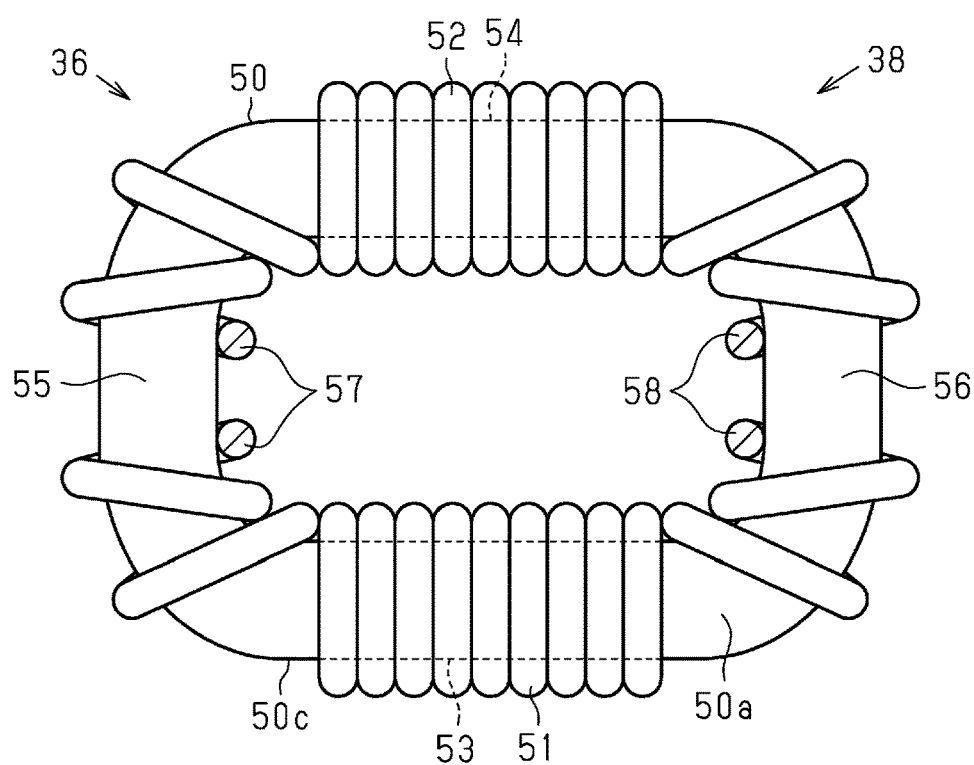
FIG. 4 is a plan view of a common mode choke coil.

As shown in FIGS. 3 and 4, the common mode choke coil 38 includes a core 50, a first winding 51, and a second winding 52. The core 50 has a closed shape. The core 50 is formed by a ferromagnetic body. The core 50 is formed by, for example, a ferrite core. The core 50 includes a first core portion 53, a second core portion 54, a first connecting portion 55, and a second connecting portion 56.

As shown in FIG. 4, the first core portion 53 and the second core portion 54 extend linearly. The first core portion 53 and the second core portion 54 have the form of, for example, a quadrangular post. The first core portion 53 and the second core portion 54 extend parallel to each other. Thus, the first core portion 53 and the second core portion 54 are arranged such that an axial direction of the first core portion 53 coincides with an axial direction of the second core portion 54. The first core portion 53 and the second core portion 54 are separated from each other and opposing each other. The first winding 51 is wound around the first core portion 53. The second winding 52 is wound around the second core portion 54. Therefore, the first winding 51 and the second winding 52 are wound around the core 50. The second winding 52 opposes the first winding 51.

The first connecting portion 55 has the form of, for example, a quadrangular post. The first connecting portion 55 connects a first end of the first core portion 53 and a first end of the second core portion 54. The second connecting portion 56 has the form of, for example, a quadrangular post. The second connecting portion 56 connects a second end of the first core portion 53 and a second end of the second core portion 54. Parts of the first winding 51 and the second winding 52 are wound around the first connecting portion 55 and the second connecting portion 56.

The first connecting portion 55 includes exposed parts free from the first winding 51 and the second winding 52. The first winding 51 and the second winding 52 wound around the first connecting portion 55 expose most of the surface of the first connecting portion 55. Thus, the first connecting portion 55 is an exposed portion where the first winding 51 and the second winding 52 are not wound and the surface of the core 50 is exposed.

The second connecting portion 56 includes exposed parts free from the first winding 51 and the second winding 52. The first winding 51 and the second winding 52 wound around the second connecting portion 56 expose most of the surface of the second connecting portion 56. Thus, the second connecting portion 56 is an exposed portion where the first winding 51 and the second winding 52 are not wound and the surface of the core 50 is exposed.

A resin member (not shown) is arranged between the core 50 and the first winding 51 and between the core 50 and the second winding 52. The resin member ensures insulation between the core 50 and the first winding 51 and between the core 50 and the second winding 52.

As shown in FIG. 3, the common mode choke coil 38 is arranged between the circuit board 34 and the base 32. The common mode choke coil 38 is oriented such that the axial direction of the first core portion 53 and the axial direction of the second core portion 54 are orthogonal to the direction in which the circuit board 34 and the base 32 oppose each other.

The common mode choke coil 38 is disposed on the base 32 with thermal grease (not shown) applied therebetween such that the first winding 51 and the second winding 52 are arranged on the surface of the base 32 that faces the inverter accommodation chamber S1. The heat generated by the first winding 51 and the second winding 52 is transferred to the surface of the base 32 facing the inverter accommodation chamber S1. Thus, the surface of the base 32 facing the inverter accommodation chamber S1 serves as a heat dissipation surface 31a. The core 50 is spaced apart from the heat dissipation surface 31a of the base 32.

A lead portion 57 extends from each of the first winding 51 and the second winding 52 wound around the first connecting portion 55. Further, a lead portion 58 extends from each of the first winding 51 and the second winding 52 wound around the second connecting portion 56. The lead portions 57 and 58 are inserted through holes 34h in the circuit board 34 and are, for example, soldered to the circuit board 34. This electrically connects the common mode choke coil 38 to the circuit board 34.

The core 50 includes a first surface 50a facing the circuit board 34. Further, the core 50 includes a second surface 50b facing the base 32. The core 50 includes a side surface 50c that connects the first surface 50a and the second surface 50b and defines the outer contour of the core 50. The side surface 50c of the core 50 corresponds to the side surface of the common mode choke coil 38.

Damping Unit 60

Figure 5:
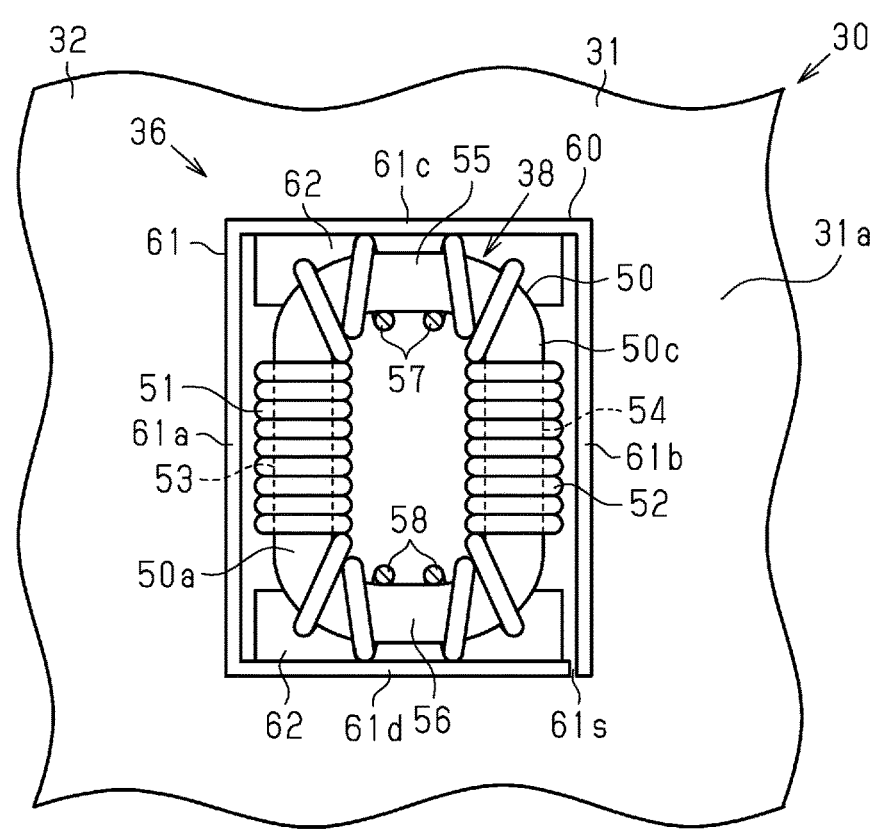
FIG. 5 is a plan view schematically showing the noise reducing unit and part of an inverter case.

As shown in FIG. 5, the inverter device 30 further includes a damping unit 60. The damping unit 60 forms a magnetic path through which leakage magnetic flux produced by the common mode choke coil 38 flows to increase leakage inductance of the common mode choke coil 38. The damping unit 60 is formed by a metal ferromagnetic body. The damping unit 60 has a relative magnetic permeability that is set to, for example, greater than "3". The damping unit 60 is formed from, for example, iron.

As shown in FIGS. 3 and 5, the damping unit 60 includes a damping side portion 61 and a damping bent portion 62. The damping side portion 61 has the form of a frame. The damping side portion 61 of the present embodiment has the form of a quadrangular frame. The damping side portion 61 includes a first wall 61a, a second wall 61b, a third wall 61c, and a fourth wall 61d. The first to fourth walls 61a to 61d each have the form of a flat plate. The first to fourth walls 61a to 61d each have the form of an elongated plate.

As shown in FIG. 3, the first to fourth walls 61a to 61d have the same length in a latitudinal direction. The first to fourth walls 61a to 61d each include a first end in the latitudinal direction located on the same plane. The first to fourth walls 61a to 61d each include a second end in the latitudinal direction located on the same plane. The first ends of the first to fourth walls 61a to 61d in the latitudinal direction define a distal end 61e of the damping side portion 61.

The longitudinal length of the first wall 61a is the same as the longitudinal length of the second wall 61b. The longitudinal length of the third wall 61c is slightly greater than the longitudinal length of the fourth wall 61d. The longitudinal length of the first wall 61a and the longitudinal length of the second wall 61b are greater than the longitudinal length of the third wall 61c.

The first wall 61a is parallel to the second wall 61b. The thickness-wise direction of the first wall 61a coincides with the thickness-wise direction of the second wall 61b. The third wall 61c is parallel to the fourth wall 61d. The thickness-wise direction of the third wall 61c coincides with the thickness-wise direction of the fourth wall 61d. A first end of the third wall 61c in the longitudinal direction is connected to a first end of the first wall 61a in the longitudinal direction. A second end of the third wall 61c in the longitudinal direction is connected to a first end of the second wall 61b in the longitudinal direction. Thus, the third wall 61c connects the first end of the first wall 61a in the longitudinal direction and the first end of the second wall 61b in the longitudinal direction. A first end of the fourth wall 61d in the longitudinal direction is connected to a second end of the first wall 61a in the longitudinal direction. A second end of the fourth wall 61d in the longitudinal direction opposes a second end of the second wall 61b in the longitudinal direction with a slight gap 61s extending therebetween.

As shown in FIG. 5, the damping side portion 61 covers the side surface 50c of the core 50. The first wall 61a extends along the side surface of the first core portion 53. The second wall 61b extends along the side surface of the second core portion 54. The third wall 61c extends along the side surface of the first connecting portion 55. The fourth wall 61d extends along the side surface of the second connecting portion 56. In this manner, the damping side portion 61 covers the side surface of the common mode choke coil 38.

As shown in FIGS. 3 and 5, the damping unit 60 is fixed to the base 32 such that the distal end 61e of the damping side portion 61 is in contact with the heat dissipation surface 31a of the base 32 with thermal grease (not shown) applied therebetween. This thermally couples the damping side portion 61 to the heat dissipation surface 31a of the inverter case 31.

The damping bent portion 62 is bent from the damping side portion 61. Specifically, the damping bent portion 62 is bent at the distal end 61e of the damping side portion 61. The damping bent portion 62 has the form of a flat plate. The damping bent portion 62 has the form of an elongated plate. The damping unit 60 includes two damping bent portions 62. One of the two damping bent portions 62 is bent from the first end of the third wall 61c in the latitudinal direction toward the fourth wall 61d. The other one of two damping bent portions 62 is bent from the first end of the fourth wall 61d in the latitudinal direction toward the third wall 61c. The longitudinal direction of the damping bent portions 62 coincides with the longitudinal direction of the third wall 61c and the fourth wall 61d. The damping bent portions 62 are slightly shorter than the fourth wall 61d in the longitudinal direction.

As shown in FIG. 5, each damping bent portion 62 is bent at the distal end 61e of the damping side portion 61 toward the common mode choke coil 38. One of the two damping bent portions 62 is located between the first connecting portion 55 and the heat dissipation surface 31a. The other one of the two damping bent portions 62 is located between the second connecting portion 56 and the heat dissipation surface 31a. Thus, each damping bent portion 62 is disposed between the exposed portion and the heat dissipation surface 31a. Also, each damping bent portion 62 is thermally coupled to the heat dissipation surface 31a. Therefore, the damping unit 60 of the present embodiment includes the damping bent portions 62 having the form of a flat plate and bent from the damping side portion 61. The damping bent portion 62 is thermally coupled to the heat dissipation surface 31a. Each damping bent portion 62 is in a planar contact with the heat dissipation surface 31a with thermal grease (not shown) applied therebetween.

Figure 6:
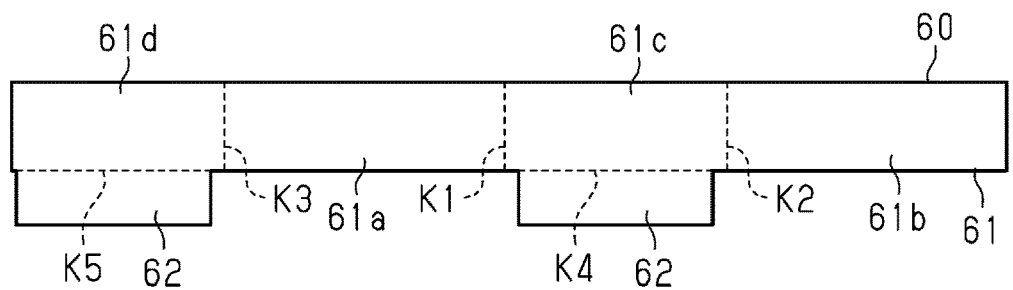
FIG. 6 is a net of a damping unit.

As shown in FIG. 6, the damping unit 60 is formed by folding a belt-shaped plate. The first wall 61a is folded on a first folding line K1 with respect to the third wall 61c. The second wall 61b is folded on a second folding line K2 with respect to the third wall 61c. The fourth wall 61d is folded on a third folding line K3 with respect to the first wall 61a. One of the two damping bent portions 62 is folded on a fourth folding line K4 with respect to the third wall 61c. The other one of the two damping bent portions 62 is folded on a fifth folding line K5 with respect to the fourth wall 61d.

Operation of Present Embodiment

The operation of the present embodiment will now be described.

Figure 7:
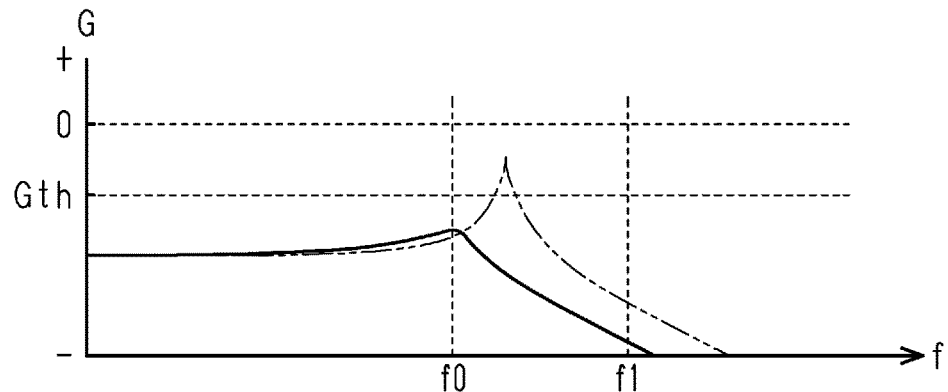
FIG. 7 is a graph showing frequency characteristics of a low-pass filter circuit in relation to normal mode noise.

FIG. 7 is a graph showing the frequency characteristics of the low-pass filter circuit 40 in relation to the normal mode noise flowing into the low-pass filter circuit 40. The solid line shown in FIG. 7 indicates the frequency characteristics when the damping unit 60 is used. The double-dashed line shown in FIG. 7 indicates the frequency characteristics when the damping unit 60 is not used. A resonance frequency (cut-off frequency) f0 of the low-pass filter circuit 40 is set to be lower than a carrier frequency f1, which is the frequency of the above-described carrier signal. The carrier frequency f1 is also referred as a switching frequency of the switching elements Qu1 to Qw2.

As indicated by the double-dashed line shown in FIG. 7, the Q factor of the low-pass filter circuit 40 is relatively high when the damping unit 60 is not arranged. This makes it difficult for the noise reducing unit 36 to reduce normal mode noise having a frequency close to the resonance frequency f0 of the low-pass filter circuit 40.

In the present embodiment, as indicated by the solid line shown in FIG. 7, the Q factor of the low-pass filter circuit 40 is relatively low because of the damping unit 60. Thus, the noise reducing unit 36 reduces the normal mode noise having a frequency close to the resonance frequency f0 of the low-pass filter circuit 40.

As shown in FIG. 7, the tolerable value of the gain (attenuation rate) G required in accordance with the specification of the vehicle is referred to as the tolerable gain Gth. The Q factor at which the gain G of the low-pass filter circuit 40 becomes equal to the tolerable gain Gth when the frequency of the normal mode noise is the same as the resonance frequency f0 is referred to as a specific Q factor. In such a configuration, in the present embodiment, the damping unit 60 causes the Q factor of the low-pass filter circuit 40 to be lower than the specific Q factor. Thus, the gain G of the low-pass filter circuit 40 when the frequency of the normal mode noise is the same as the resonance frequency f0 is smaller (greater in absolute value) than the tolerable gain Gth. In other words, the damping unit 60 is configured to set the Q factor of the low-pass filter circuit 40 to lower than the specific Q factor.

The damping unit 60 increases the leakage inductance of the common mode choke coil 38. Thus, the resonance frequency f0 of the low-pass filter circuit 40 in the present embodiment is low compared to when the damping unit 60 is not used. Accordingly, as shown in FIG. 7, the gain G in the frequency band that is higher than the resonance frequency f0 is small compared to when the damping unit 60 is not used. This optimally reduces the normal mode noise having a frequency band higher than the resonance frequency f0.

The flow of the leakage magnetic flux through the damping unit 60 generates an eddy current in the damping unit 60. The damping unit 60 converts the eddy current in the damping unit 60 to heat. Thus, the damping unit 60 acts as a resistor with respect to the leakage magnetic flux.

Further, the heat generated by the damping unit 60 is transferred from the distal end 61e of the damping side portion 61 to the heat dissipation surface 31a. The heat generated by the damping unit 60 is also transferred from the damping bent portion 62, in addition to the distal end 61e of the damping side portion 61, to the heat dissipation surface 31a. This facilitates dissipation of the heat generated by the damping unit 60 from the heat dissipation surface 31a compared to when the damping unit 60 does not include the damping bent portions 62.

Advantages of Embodiment

The above embodiment has the following advantages.
(1) The damping unit 60 includes the damping bent portion 62 having the form of a flat plate and bent from the damping side portion 61. The damping bent portion 62 is thermally coupled to the heat dissipation surface 31a. This transfers the heat generated by the damping unit 60 from the damping bent portion 62, in addition to the damping side portion 61, to the heat dissipation surface 31a of the inverter case 31. Therefore, the heat generated by the damping unit 60 is dissipated from the heat dissipation surface 31a more easily than when the damping unit 60 does not include the damping bent portions 62. This improves heat dissipation of the damping unit 60.
(2) The damping unit 60 includes two damping bent portions 62. Thus, the heat generated by the damping unit 60 is dissipated from the heat dissipation surface 31a more easily than when, for example, there is only one damping bent portion 62. This further improves heat dissipation of the damping unit 60.
(3) The damping bent portion 62 is bent from the damping side portion 61 toward the common mode choke coil 38. In a comparative example, the damping bent portion 62 is bent from the damping side portion 61 toward a side opposite to the common mode choke coil 38. As compared to the comparative example, in the present embodiment, the overall size including the common mode choke coil 38 and the damping unit 60 is relatively small. This allows the motor-driven compressor 11 to be reduced in size.
(4) In a comparative example, the damping bent portion 62 is arranged between the heat dissipation surface 31a and the first winding 51 or the second winding 52. In this case, the damping bent portion 62 obstructs heat transfer from the first winding 51 or the second winding 52 to the heat dissipation surface 31a of the inverter case 31. This adversely affects heat dissipation of the first winding 51 or the second winding 52. To avoid such a situation, the damping bent portions 62 are respectively arranged between the heat dissipation surface 31a and the first connecting portion 55, which is an exposed portion, and between the heat dissipation surface 31a and the second connecting portion 56, which is an exposed portion. This ensures heat dissipation of the first winding 51 and the second winding 52 even when the damping bent portions 62 are bent at the distal end 61e of the damping side portion 61 toward the common mode choke coil 38. In this manner, the damping bent portions 62 are bent at the distal end 61e of the damping side portion 61 toward the common mode choke coil 38 while maintaining heat dissipation of the first winding 51 and the second winding 52.

Modified Examples

The above embodiment may be modified as described below. The above embodiment and the following modifications can be combined as long as the combined modifications remain technically consistent with each other.

Figure 8:
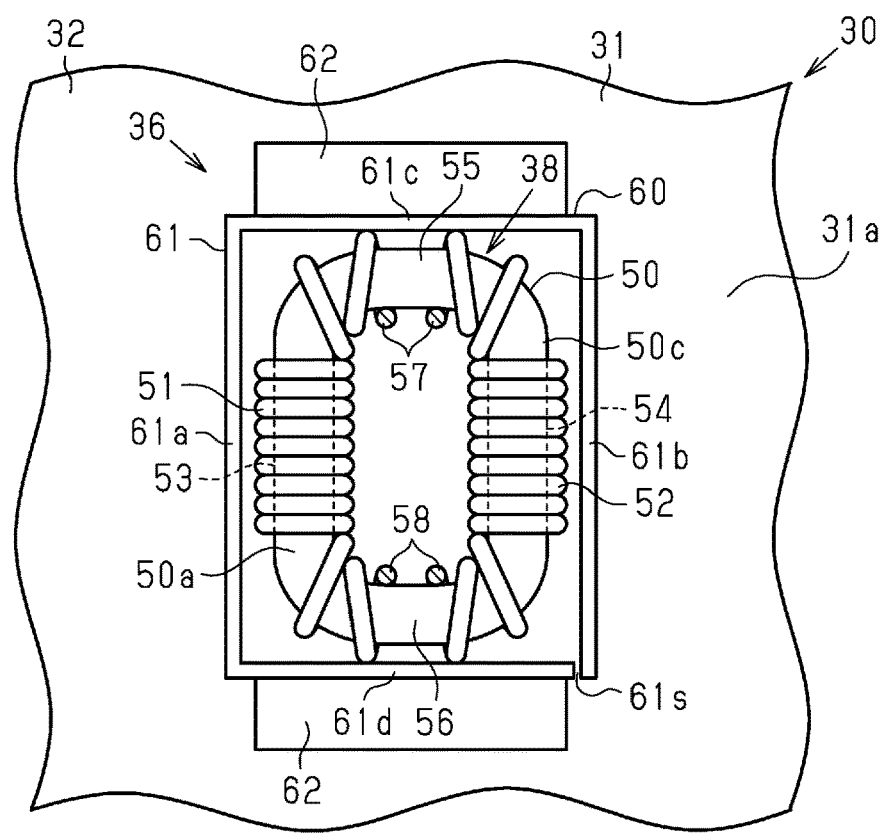
FIG. 8 is a plan view schematically showing a noise reducing unit and part of an inverter case in accordance with another embodiment.

As shown in FIG. 8, each damping bent portion 62 may be bent from the damping side portion 61 toward a side opposite to the common mode choke coil 38. This allows the damping bent portions 62 to be bent from the damping side portion 61 and thermally coupled to the heat dissipation surface 31a without taking into consideration the position of the common mode choke coil 38, in particular, the positions of the first winding 51 and the second winding 52. This improves the degree of freedom for layout of the damping unit 60. Also, the heat dissipation surface 31a readily dissipates the heat generated by part of the first winding 51 and the second winding 52 wound around the first connecting portion 55 and the heat generated by part of the first winding 51 and the second winding 52 wound around the second connecting portion 56.

In the present embodiment, there is no particular limitation on the number of damping bent portions 62.

In the present embodiment, for example, the damping bent portion 62 may be disposed between the heat dissipation surface 31a and the first winding 51 or the second winding 52.

In the present embodiment, the damping side portion 61 does not have to have the form of a quadrangular frame. The damping side portion 61 may be, for example, ring-shaped. The shape of the damping side portion 61 is not particularly limited as long as the damping side portion 61 covers at least part of the side surface of the common mode choke coil 38. Accordingly, the damping side portion 61 does not have to be frame-shaped and may include, for example, only the third wall 61c.

In the present embodiment, the shape of the core 50 is not particularly limited as long as the core 50 has a closed-shape.

In the present embodiment, the damping unit 60 is formed by folding a belt-shaped panel. However, there is no limitation to such a configuration. For example, the damping unit 60 may be a rectangular tube in which the second wall 61b is connected with the fourth wall 61d.

In the present embodiment, the first winding 51 and the second winding 52 do not have to be wound around the first connecting portion 55.

In the present embodiment, the first winding 51 and the second winding 52 do not have to be wound around the second connecting portion 56.

In the present embodiment, the base 32 may be in direct contact with the outer surface of the end wall 15a of the suction housing 15 without the thermal grease applied therebetween.

In the present embodiment, the damping unit 60 may be fixed to the base 32 such that the distal end 61e of the damping side portion 61 is in direct contact with the heat dissipation surface 31a of the base 32 without the thermal grease applied therebetween. In this case, each damping bent portion 62 also directly contacts the heat dissipation surface 31a without the thermal grease applied therebetween.

In the present embodiment, the damping unit 60 may be fixed to the suction housing 15 such that the distal end 61e of the damping side portion 61 is in contact with a heat dissipation surface of the end wall 15a of the suction housing 15 with thermal grease applied therebetween. In this case, each damping bent portion 62 also contacts the heat dissipation surface of the end wall 15a of the suction housing 15 with the thermal grease applied therebetween.

In the present embodiment, the damping unit 60 may be fixed to the suction housing 15 such that the distal end 61e of the damping side portion 61 is in direct contact with the heat dissipation surface of the end wall 15*a* of the suction housing 15 without the thermal grease applied therebetween. In other words, the damping side portion 61 may only be thermally coupled to the heat dissipation surface of the inverter case 31 or the housing 14. In this case, each damping bent portion 62 is also in direct contact with the heat dissipation surface of the end wall 15*a* of the suction housing 15 without the thermal grease applied therebetween.

In the present embodiment, the damping bent portion 62 does not have to be bent at the distal end 61*e* of the damping side portion 61. In other words, the damping bent portion 62 may be bent from anywhere on the damping side portion 61.

In the present embodiment, the compression unit 18 does not have to be a scroll type and may be, for example, a piston type, a vane type, or the like.

In the present embodiment, the motor-driven compressor 11 is for use with the vehicle air conditioner 10. However, there is no limitation to such a configuration. For example, the motor-driven compressor 11 may be installed in a fuel cell vehicle and compresses air, which is a fluid supplied to the fuel cell, with the compression unit 18.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A motor-driven compressor, comprising:
a housing into which fluid is drawn;
a compression unit configured to compress the fluid;
an electric motor configured to drive the compression unit; and
an inverter device configured to drive the electric motor, wherein:
the inverter device includes
an inverter circuit configured to convert direct-current power to alternating-current power,
a noise reducing unit arranged at an input side of the inverter circuit and configured to reduce common mode noise and normal mode noise included in the direct-current power before the direct-current power is input to the inverter circuit, and
an inverter case thermally coupled to the housing and accommodating the inverter circuit and the noise reducing unit;
the noise reducing unit includes
a common mode choke coil, and
a smoothing capacitor forming a low-pass filter circuit with the common mode choke coil;
the common mode choke coil includes
a core having a closed shape,
a first winding wound around the core, and
a second winding wound around the core opposing the first winding;
the inverter device further includes a damping unit that forms a magnetic path through which leakage magnetic flux produced by the common mode choke coil flows to increase leakage inductance of the common mode choke coil;
the damping unit is formed from a metal ferromagnetic body;
the damping unit includes a damping side portion that covers at least part of a side surface of the common mode choke coil;
the damping side portion is thermally coupled to a heat dissipation surface of the inverter case or the housing; and
the damping unit includes a damping bent portion having the form of a flat plate and bent from the damping side portion, the damping bent portion thermally coupled to the heat dissipation surface.

2. The motor-driven compressor according to claim 1, wherein:
the damping bent portion is one of two damping bent portions; and
the damping unit includes the two damping bent portions.

3. The motor-driven compressor according to claim 1, wherein the damping bent portion is bent from the damping side portion toward the common mode choke coil.

4. The motor-driven compressor according to claim 3, wherein:
the core includes
a first core portion around which the first winding is wound,
a second core portion around which the second winding is wound, and
an exposed portion where a surface of the core is exposed and free from the first winding and the second winding; and
the damping bent portion is arranged between the exposed portion and the heat dissipation surface.

5. The motor-driven compressor according to claim 1, wherein the damping bent portion is bent from the damping side portion toward a side opposite to the common mode choke coil.

* * * * *